United States Patent [19]

Inoue et al.

[11] Patent Number: 4,652,784

[45] Date of Patent: Mar. 24, 1987

[54] TRAPPED-ENERGY MODE RESONATOR AND METHOD OF MANUFACTURING THE SAME

[75] Inventors: Takeshi Inoue; Masanori Suzuki, both of Tokyo, Japan

[73] Assignee: NEC Corporation, Tokyo, Japan

[21] Appl. No.: 773,160

[22] Filed: Sep. 6, 1985

[30] Foreign Application Priority Data

Sep. 6, 1984 [JP] Japan .................................. 59-186823

[51] Int. Cl.$^4$ ............................................. H01L 41/08
[52] U.S. Cl. ..................................... 310/320; 310/366
[58] Field of Search ................ 310/320, 348, 366, 369

[56] References Cited

U.S. PATENT DOCUMENTS

| | | | |
|---|---|---|---|
| 2,635,199 | 4/1953 | Wolfskill | 310/366 |
| 3,363,119 | 1/1968 | Koneval et al. | 310/320 |
| 3,891,872 | 6/1975 | Nagata et al. | 310/320 |
| 4,184,095 | 1/1980 | Stacchiotti et al. | 310/366 |

FOREIGN PATENT DOCUMENTS

| | | | |
|---|---|---|---|
| 2913798 | 10/1979 | Fed. Rep. of Germany | 310/320 |
| 0131894 | 10/1979 | Japan | 310/366 |

*Primary Examiner*—Mark O. Budd
*Attorney, Agent, or Firm*—Sughrue, Mion, Zinn, Macpeak and Seas

[57] ABSTRACT

A trapped-energy mode resonator is obtained by forming conductive patterns on sheets of ceramic material and then laminating the ceramic material to obtain a resonator wherein a pair of central electrodes oppose one another through a central portion of the ceramic and peripheral electrodes oppose one another through peripheral portions of the ceramic, with the central and peripheral electrodes not overlapping one another. The distance between the central electrodes is shorter than the distance between the peripheral electrodes, with the central electrodes being embedded within the ceramic and the peripheral electrodes being either embedded within or formed on the surface of the ceramic.

6 Claims, 7 Drawing Figures

FIG. 3
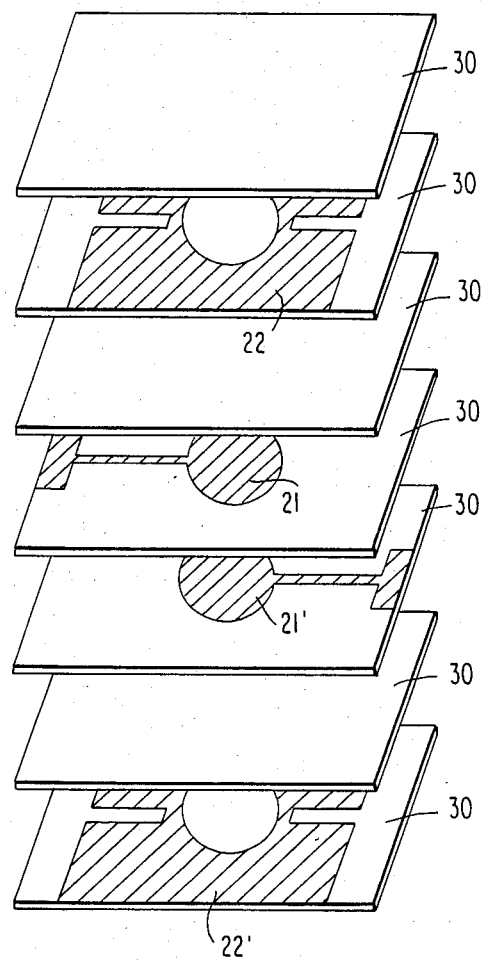
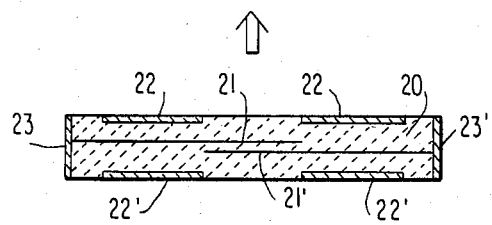
FIG. 4
FIG. 5
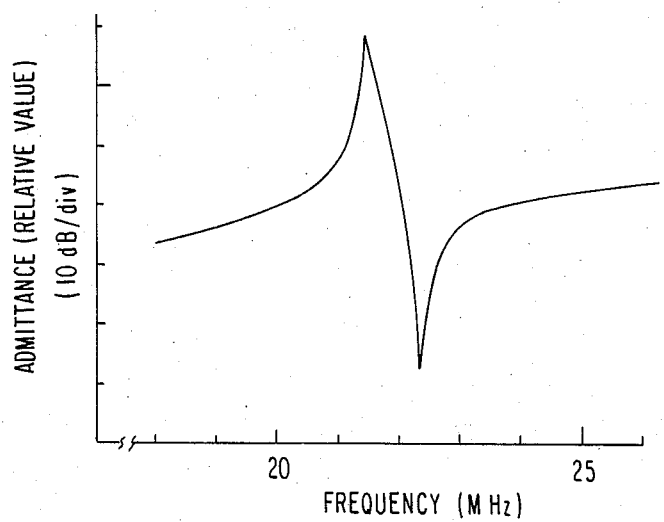

TRAPPED-ENERGY MODE RESONATOR AND METHOD OF MANUFACTURING THE SAME

BACKGROUND OF THE INVENTION

This invention relates to a piezoelectric resonator of a thickness-extensional vibration mode, and more particularly to a trapped-energy mode resonator using a piezoelectric ceramic material having a Poisson's ratio of less than one third.

Thickness-extensional mode piezoelectric resonators are composed of a piezoelectric plate which is polarized in the thickness direction and sandwiched between electrodes. In such resonators, however, a number of spurious vibrations are excited near the main resonance as a consequence of mode-coupling with high-order radial vibrations. These spurious responses resulting from contour vibrations can be excluded through a so-called "forward-wave energy-trapping" technique using a partially-electroded piezoelectric plate. In this case, thickness-extensional vibration is confined to an electroded region and does not couple with radial vibrations. To this end, the cutoff frequency is lowered relative to the surrounding region by electrode mass-loading and a piezoelectric effect. This forward-wave energy-trapping technique can be applied to only those piezoelectric materials having a Poisson's ratio of one third or more.

U.S. Pat. No. 3,891,872 discloses a new type of thickness-extensional trapped-energy mode piezoelectric resonator using a piezoelectric plate having a Poisson's ration of less than one third, in which the so-called "backward-wave energy-trapping" technique is used to realize the energy-trapping by slightly reducing the plate thickness locally in the electroded region so as to make a cutoff frequency in the electroded region higher than the cutoff frequency in the surrounding region. However, this technique requires extremely precise control to realize an appropriate thickness ratio between the electroded portion and surrounding region.

Another method of realizing the backward-wave energy-trapping is described in "Energy-Trapping for Backward-Wave Mode Thickness-Vibrations by Controlling Piezoelectric Reaction" in the Transactions of the Institute of Electronics and Communication Engineers of Japan, Vol. J.62-A, No. 1, pp. 8-15 (January 1979) in which a piezoelectric plate of uniform thickness is used and the surrounding region as well as the central trapping region of the plate is electroded, with the electrodes in the surrounding region being short-circuited. The inner and outer electrodes are insulated by an annular unelectroded gap of small width. In addition, a capacitor element is connected in series with the central electrodes. The cutoff frequency at the electroded regions is lowered by the effect of the piezoelectric reaction. However, since the series capacitor reduces the magnitude of the reduction of the cutoff frequency at the control electroded region, the backward-wave energy-trapping can be realized without resorting to the thickness difference of the piezoelectric plate. Although this method facilitates the realization of the backward-wave mode energy-trapping, the usage of an additional capacitor element deteriorates the stability of the resonant frequency due to the difficulty of matching the temperature coefficient of the capacitor element and the piezoelectric plate.

SUMMARY OF THE INVENTION

Accordingly, it is an object of the invention to provide a trapped-energy mode resonator which facilitates the backward-wave mode energy-trapping condition without an additional capacitor element.

Another object of the invention is to provide a trapped-energy mode resonator vibrating in the thickness-extensional mode and having a Poisson's ratio of less than one third, which is operable with a stable resonant frequency.

A further object of the invention is to provide a trapped-energy mode resonator in which the resonant frequency can be easily determined.

According to the present invention, there is provided a trapped-energy mode resonator comprising a pair of energy-trapping electrodes which are oppposedly embedded within a piezoelectric ceramic plate having a Poisson's ratio of less than one third, and a pair of short-circuited peripheral electrodes which are oppposedly arranged within or on the surface of the ceramic plate so as not to overlap the energy-trapping central electrodes in the thickness direction of the ceramic plate. The distance between the two energy-trapping electrodes is shorter than the distance between the two short-circuited peripheral electrodes.

According to another aspect of this invention, a method of manufacturing a trapped-energy resonator is provided. This method is characterized by preparing green sheets containing piezoelectric ceramic powder and organic binder, applying a layer of conductive paste on the surface of each green sheet in a pattern corresponding to each energy-trapping electrode or short-circuited electrode, bonding these green sheets into one body, and sintering the united green sheets.

BRIEF DESCRIPTION OF THE DRAWINGS

FIG. 3 is an exploded perspective view of the laminated structure of the embodiment of a resonator according to the invention;

FIG. 4 is a sectional view of another embodiment of a resonator showing the state in which the short-circuited electrodes are exposed to the surfaces; and FIG. 5 is a characteristic curve of the frequency response of a resonator according to the invention.

DESCRIPTION OF THE PREFERRED EMBODIMENTS

Figure 1A:
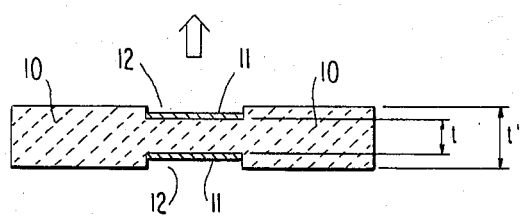
FIGS. 1A and 1B are a sectional view and a plan view, respectively, of an example of a conventional trapped-energy mode resonator.
Figure 1B:
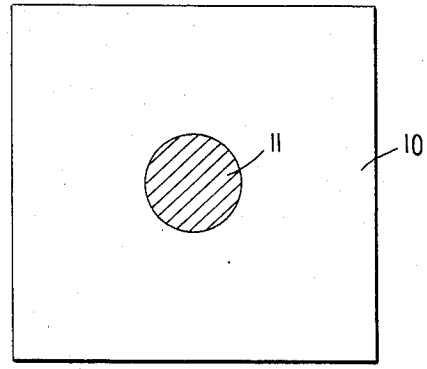

Referring to FIGS. 1A and 1B, a prior art trapped-energy mode resonator is composed of a polarized lead titanate piezoelectric ceramic plate 10, and energy-trapping electrodes 11 provided in recesses 12 formed on the top and bottom surfaces of the ceramic plate 10. In FIG. 1, the symbol t shows the plate thickness of the portion of the plate having energy-trapping electrodes (hereinafter, the electrode portion), t' shows the plate thickness of the rest of the ceramic plate (hereinafter, peripheral portion), and the arrow shows the direction of polarization. The principle of energy-trapping shown in FIG. 1 is that backward-wave mode energy-trapping is achieved by making the plate thickness t of the electrode portion thinner than the plate thickness t' of the peripheral portion and by utilizing the fact that the cutoff frequency is inversely proportional to the plate thickness, thereby heightening the cutoff frequency at the electrode portion in comparison with the cutoff frequency at the peripheral portion. However, the relationship of t' . t is not itself sufficient for good energy-trapping. Unless t/t' corresponds to a predetermined ratio, good energy trapping cannot be achieved. In the case of lead titanate piezoelectric ceramic, for example, it is preferable to choose t/t' to be in the range of 0.859 to 0.908 as mentioned in the aforementioned U.S. patent. Accordingly, it is necessary to extremely precisely control the plate thickness of the recesses 12 provided on the piezoelectric ceramic plate 10, and the recesses 12 must have parallel surfaces with respect to each other. Such precise processing is difficult from a manufacturing viewpoint. Since the electrodes 11 are provided in the recesses 12 in the resonator shown in FIG. 1, frequency control appears to be easily carried out by controlling the thickness of the ceramic plate 10 by means of parallel plane lapping operation, but it is in fact difficult, because the lapping operation makes the ratio of thickness t/t' larger than the optimal ratio for good energy-trapping.

Figure 2A:
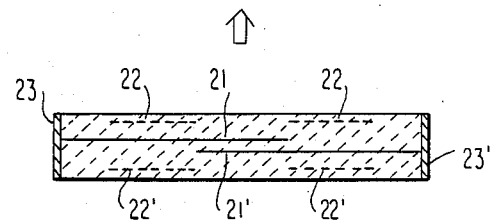
FIG. 2A and 2B are a sectional view and a plan view, respectively, of an embodiment of a trapped-energy mode resonator according to the invention.
Figure 2B:
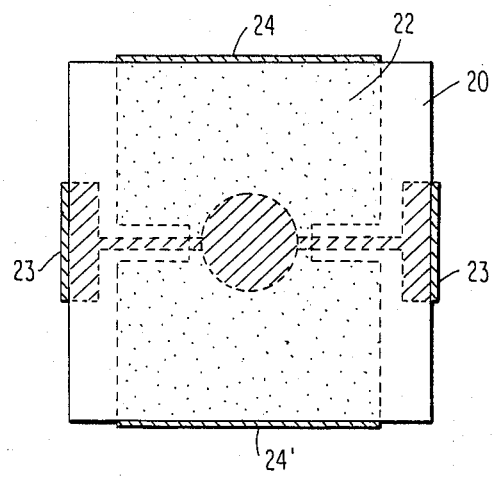

Referring to FIGS. 2A and 2B, the basic structure of a trapped-energy mode resonator according to the invention is shown. Within a piezoelectric ceramic plate 20 which is polarized uniformly in the thickness direction, energy-trapping central electrodes 21, 21' are embedded at predetermined intervals and at opposing positions, and leads extend from the central electrodes 21, 21' to a pair of lead electrodes 23, 23', respectively, which are provided on a first pair of opposing sides of the ceramic plate 20. Opposing short-circuited peripheral electrodes 22, 22' are provided so as not to overlap the energy-trapping electrodes in the thickness direction. Short-circuiting of the peripheral electrodes is easily executed by providing end surface electrodes 24, 24' on a second pair of opposing sides of the ceramic plate 20, respectively, by a method such as deposition, plating or baking. Electric input/output terminals may be drawn from the lead electrodes 23, 23' provided on the first pair of opposing side surfaces.

The material of the piezoelectric plate can be any monocrystalline piezoelectric material or piezoelectric ceramic material having a Poisson's ratio less than one third. For example, lead titanate piezoelectric ceramics are suitable for the piezoelectric plate of the resonator of the invention.

The reasons that a resonator according to the invention is able to achieve good energy-trapping are as follows. When there are no opposing electrodes on the piezoelectric ceramic plate, the cutoff frequency of energy trapping is approximately equal to the mechanical resonance frequency $f_a$ (which electrically corresponds to the anti-resonant frequency) of the piezoelectric ceramic plate. When there are short-circuited electrodes on the top and bottom surfaces of the piezoelectric ceramic plate, the cutoff frequency is lowered to a far lower value than $f_a$ chiefly by piezoelectric reaction, in accordance with coupling coefficient $k_t$, and the cutoff frequency becomes equal to the electric resonance frequency $f_r$. When electrodes are embedded in the piezoelectric ceramic plate as in this invention, the cutoff frequency takes the intermediate value between $f_a$ and $f_r$, and the smaller the distance between the opposing electrodes in the piezoelectric ceramic plate is in comparison with the plate thickness of the ceramic plate, the smaller the amount that the piezoelectric reaction will lower the cutoff frequency. In a resonator according to the invention, the cutoff frequency at the electrode portion of the ceramic plate 20 is made higher than the cutoff frequency at the peripheral portion of the ceramic plate 20 by controlling the lowering of the cutoff frequency caused by piezoelectric reaction by making the distance between the energy-trapping electrodes 21, 21' shorter than the distance between the short-circuited electrodes 22, 22'. As a result, good energytrapping is constantly achieved in the resonator according to the invention. Accordingly, since the resonator itself according to the invention can constantly achieve good energy-trapping without using an additional capacitive element, the problem of the remarkable decrease in the stability of the resonant frequency which would be produced if an additional capacitive element were used can thus be avoided. According to experimental results using a lead titanate as a piezoelectric ceramic material, it is desirable that the ratio of the distance d between the energy-trapping electrodes and the distance d' between the short-circuited electrodes range from 0.2 to 0.92. If the ratio of d to d' exceeds 0.92, an additional series capacitor is required to achieve good energy-trapping. On the other hand, when the ratio is lower than 0.2, it becomes difficult to isolate the pair of opposed energy-trapping electrodes. From a theoretical point of view, the above lower limit of the distance ratio can be selected smaller than 0.2 but larger than zero. According to the present invention, therefore, the energy-trapping condition are not as critical compared with the resonator of FIG. 1.

In addition, since the surface of the energy-trapping electrode is covered with a ceramic layer in a resonator according to the invention, frequency control is possible by lapping the ceramic plate so as to control the thickness thereof. For the above-described reasons, a resonator according to the invention involves no factor leading to obstruction of energy-trapping when frequency is controlled by lapping the ceramic plate.

There is no critical relation for the diameter of the energy-trapping electrodes, unlike for the thickness relation.

A method of manufacturing a resonator according to the invention will now be explained. This resonator can be manufactured by utilizing a well known manufacturing technique used for multilayer laminated ceramic capacitors. FIG. 3 is an exploded perspective view of the laminated structure of the resonator. The energy-trapping central electrodes 21, 21' and the short-circuited peripheral electrodes 22, 22' are formed on each of the green sheets 30 which contain piezoelectric ceramic powder and organic binder by a screen printing process, or the like, using conductive paste.

The green sheets having the electrodes printed thereon and the green sheets without electrodes shown in FIG. 3 are laminated in the thickness direction by contact bonding, and are then sintered in an electric furnace at a temperature of about 1200° C. This sintered product is thereafter uniformly polarized in the thickness direction, whereby a resonator according to the invention as shown in FIG. 2 is produced. In this manufacturing process, accurate positioning of the upper and lower electrodes 21, 21', 22 and 22' is achieved by using a known technique for a ceramic multi-layer substrate. This method according to the invention enables the manufacture of a multiplicity of resonator tips as shown in FIG. 2 in one wafer at high accuracy, and is thus efficient in terms of mass productivity.

In the above-described embodiment of a trapped-energy mode resonator, the short-circuited electrodes are within the piezoelectric plate, but the efficiency of the resonator is not lessened at all when the short-circuited electrodes are exposed to the surface at the stage of parallel plane lapping process, as is shown in FIG. 4. Incidentally, in a case where strict frequency control is not necessary during use, it is also possible to manufacture a resonator by lapping the surface of a ceramic plte having built-in energy-trapping electrodes and thereafter forming short-circuited electrodes on the surface of the ceramic plate by a method such as deposition or plating.

EXAMPLE 1

A typical example of a fundamental thickness-extensional mode backward-wave type trapped-energy mode resonator has the structure shown in FIG. 2 and uses $Pb_{0.85}\{Ti_{0.941}(Mn_{1/3}Sb_{2/3})_{0.05}Ga_{0.012}\}O_3$ as a piezoelectric ceramic material. The density of this ceramic material is $7.38 \times 10^3$ $K8/m^3$, the thickness-extensional coupling coefficient $k_t$ is 0.47, and the relative dielectric constant $E_{33}T/E_o$ is 196. The distance between the energy-trapping electrodes 21, 21' is 25 μm, the distance between the short-circuited peripheral electrodes 95 μm, and the plate thickness of the ceramic plate 120 μm. The diameter of each energy-trapping electrode is 5 mm. When a resonance frequency of the resonator is controlled by parallel plate polishing of the polarized ceramic plate 20, a resonance frequency of just 21.4 Mhz is obtained when the plate thickness is reduced to 103 μm. FIG. 5 shows the resonance, anti-resonance frequency response at this time. It is clear from FIG. 5 that good energy-trapping is being achieved.

As is described in detail, a trapped-energy mode resonator according to the invention is very advantageous in that it enables good energy-trapping in the fundamental thickness-extensional vibration mode, and facilitates frequency control, thereby allowing efficient mass productivity.

What is claimed is:

1. A trapped-energy mode resonator comprising: a laminated plate of a plurality of piezoelectric layers having a Poisson's ratio less than one third; a pair of energy-trapping electrodes sandwiching at least one of said piezoelectric layers; a pair of short-circuited electrodes sandwiching at least two of said piezoelectric layers; said short-circuited electrodes being oppositely arranged within or on the surface of said laminated plate so as not to overlap said energy-trapping electrodes in the thickness direction of said laminated plate; the distance between said energy-trapping electrodes being shorter than the distance between said short-circuited electrodes, whereby the resonant frequency of said fundamental thickness-extension vibration of said laminated plate at the region of said energy-trapping electrodes is higher than the resonant frequency of said laminated plate at the region of said short-circulated electrodes.

2. A trapped-energy mode resonator as claimed in claim 1, further comprising at least two side surfaces, a pair of lead electrodes provided on two of said at least two side surfaces respectively, said lead electrodes being connected to said energy-trapping electrodes respectively, said lead electrodes being arranged so as not to overlap each other in the thickness direction of said laminated plate, and said short-circuited electrodes having slits at the region opposing said lead electrodes such that said lead electrodes do not overlap said short-circuited electrodes in the thickness direction of said laminated plate.

3. A trapped-energy mode resonator as claimed in claim 1, wherein said piezoelectric plate is of a lead titanate piezoelectric ceramic and the ratio of the distance between said energy-trapping electrodes and the distance between said short-circuited electrodes is from 0.2 to 0.92.

4. A trapped-energy mode resonator, comprising:
a piezoelectric material;
a pair of central electrodes opposing one another at a central portion of said piezoelectric material, the thickness of said piezoelectric material at said central portion being greater than a distance between said central electrodes; and
a pair of peripheral electrodes opposing one another through a peripheral portion of said piezoelectric material.

5. A trapped-energy mode resonator as claimed in claim 4, wherein said central and peripheral portions of said piezoelectric material are non-overlapping.

6. A trapped-energy mode resonator as claimed in claim 4, wherein the thickness of said piezoelectric material in said peripheral portion is greater than the distance between said peripheral electrodes.

* * * * *

UNITED STATES PATENT AND TRADEMARK OFFICE
CERTIFICATE OF CORRECTION

PATENT NO. : 4,652,784

DATED : March 24, 1987

INVENTOR(S) : Takeshi INOUE & Masanori SUZUKI

It is certified that error appears in the above-identified patent and that said Letters Patent is hereby corrected as shown below:

Column 3, line 6, change "t' . t" to --t' > t--.

Column 5, line 11, change "plte" to --plate--.

Signed and Sealed this

Fifth Day of April, 1988

*Attest:*

DONALD J. QUIGG

*Attesting Officer*  *Commissioner of Patents and Trademarks*